(12) United States Patent
Geukes et al.

(10) Patent No.: US 10,156,610 B2
(45) Date of Patent: *Dec. 18, 2018

(54) ON-CHIP SEQUENCE PROFILER

(71) Applicant: International Business Machines Corporation, Armonk, NY (US)

(72) Inventors: Benedikt Geukes, Stuttgart (DE);
Manfred Walz, Boeblingen (DE);
Matteo Michel, Chemnitz (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/585,203

(22) Filed: May 3, 2017

(65) Prior Publication Data

US 2018/0321314 A1 Nov. 8, 2018

(51) Int. Cl.
*G01R 31/3185* (2006.01)

(52) U.S. Cl.
CPC ........ *G01R 31/318525* (2013.01); *G01R 31/318541* (2013.01)

(58) Field of Classification Search
CPC ........ G01R 31/318525; G01R 31/318541
See application file for complete search history.

(56) References Cited

U.S. PATENT DOCUMENTS

| | | | |
|---|---|---|---|
| 8,943,377 B2 * | 1/2015 | Harper | G06F 11/3089 714/718 |
| 8,996,938 B2 | 3/2015 | Dervisoglu et al. | |
| 9,229,053 B2 | 1/2016 | Krishnani et al. | |
| 9,513,334 B2 * | 12/2016 | Shanker | G01R 31/31705 |
| 2002/0100025 A1 * | 7/2002 | Buechner | G06F 11/3447 717/131 |

OTHER PUBLICATIONS

Geukes et al., "On-Chip Sequence Profiler", U.S. Appl. No. 15/834,274, filed Dec. 7, 2017.
List of IBM Patents or Patent Applications Treated as Related, dated Dec. 6, 2017, 2 pages.
Accelerated Examination Support Document, 17 pages, dated Dec. 5, 2017.

* cited by examiner

*Primary Examiner* — Thien Nguyen
*Assistant Examiner* — Rong Tang
(74) *Attorney, Agent, or Firm* — Daniel C. Housley

(57) ABSTRACT

A method, circuit, and design structure for an on-chip sequence profiler involves a programmable matrix and FSM in a logic circuit, a first latch receiving a scan path bit sequence and a first clock signal and generating a first output to control a select input of a first multiplexer, a first multiplexer selecting among functional path bit sequences and outputting a bit sequence to a second latch, a second latch receiving the bit sequence from the first multiplexer and a second clock signal via a second multiplexer and outputting a bit sequence to a logic circuit, a logic circuit receiving the bit sequence from the second latch and outputting a clock control signal to the clock and a second selector control signal to the second multiplexer, and a second multiplexer receiving a second clock signal from the clock and outputting the second clock signal to the second latch.

19 Claims, 5 Drawing Sheets

ON-CHIP SEQUENCE PROFILER

BACKGROUND

The present disclosure relates to a design structure, and more specifically to a design structure for profiling sequences applied to electronic circuits.

At the circuit level, software is executed on hardware by passing bit sequences through circuit elements, such as, for example, latches, multiplexers, various gates, etc. Design, production, and testing of circuits may rely on theoretic execution or simulations to determine the most likely order that a circuit's elements execute a given bit sequence, or upon comparison of a final bit sequence output to an expected output. Under certain circumstances, software may require a given sequence to be executed on hardware in an exact order of circuit elements.

SUMMARY

Embodiments of the present disclosure include a method for profiling on-chip application sequences. A matrix for a logic circuit is generated for a profiling event. The matrix has a first dimension corresponding to a sequence of time periods in the profiling event and a second dimension corresponding to a set of profilers. The programmable elements of the matrix store a control signal applied to the profiler during a first time period of a sequence of time periods. A first bit of a scan sequence is stored in a first latch of the first profiler. A first multiplexer of the first profile selects, based on the first bit, a first bit sequence of a set of two or more bit sequences. In response to determining to capture the first bit sequence, a second latch of the first profiler latches a second bit of the first bit sequence during the first time period. The determination is made, via the logic circuit, whether the latched second bit has an expected value, where the expected value is indicated by the control signal and the first time period. In response to determining that the second bit has the expected value, the second latch is disabled.

Embodiments of the present disclosure further include a circuit and design structure for an on-chip application sequence profiler. A first latch of the sequence profiler receives a scan path bit sequence and a first clock signal, and the first latch generates a first output in response to the scan path bit sequence and the first clock signal. A first multiplexer of the sequence profiler is coupled to the first latch. The first multiplexer receives at least two functional path bit sequences and the first output to control a select input of the first multiplexer. The first multiplexer generates a second output in response to the functional path bit sequence and the first output. A second latch of the sequence profiler is coupled to the first multiplexer. The second latch receives the second output and a latch control signal. A second multiplexer of the sequence profiler generates the latch control signal. The second multiplexer receives an input from a second clock signal and a select control signal. A logic circuit of the sequence profiler is coupled to the second latch and the second multiplexer. The logic circuit receives a second output from the second latch and generates, using the second output, the select control signal.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
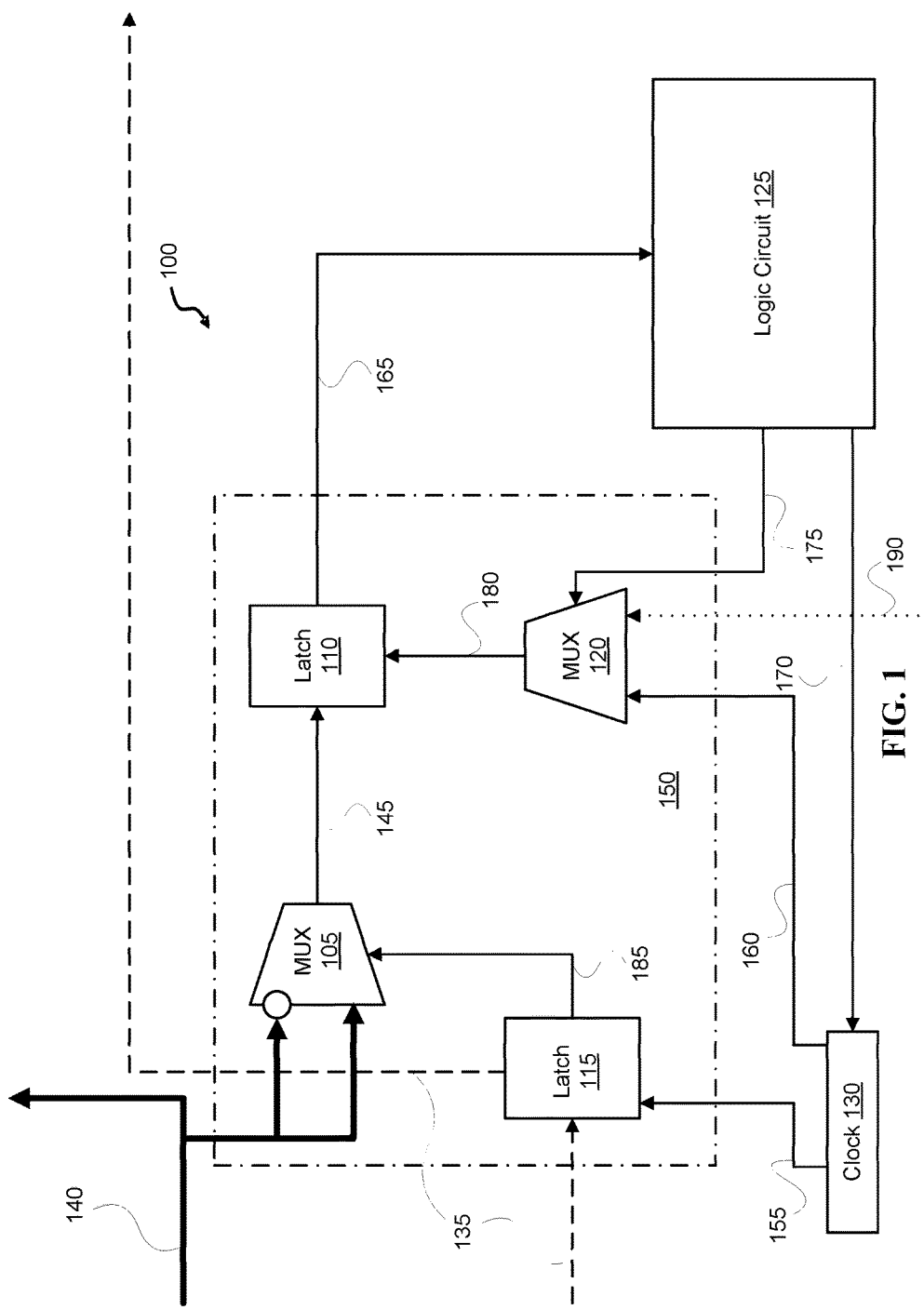
FIG. 1 depicts a checkpoint element, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to design structures and electronic circuits, and more specifically, to profiling sequences applied to electronic circuits. While the present disclosure is not necessarily limited to such applications, various aspects of the disclosure may be appreciated through a discussion of various examples using this context.

In current chips, we may have a particular sequence the software requires, but we have little means for guaranteeing the hardware is performing to expectation, or in the order of elements theorized. An apparatus that can track the sequence as it is applied to internal latches and keep track of whether the sequences were executed successfully would be capable of providing valuable debugging information or identifying when a sequence has been inadvertently altered.

Embodiments of the present disclosure are directed towards an on-chip sequence profiler that can track a bit sequence applied to internal latches of a chip and provide information on which sequences were executed successfully, and otherwise provide specific debugging information regarding which latch/latches did not execute the sequence successfully. Embodiments of the present disclosure may, for example, be helpful in discovering a sequence that was inadvertently altered, or in pinpointing a failure among circuit elements within a chip.

According to various embodiments, the on-chip sequence profiler may include checkpoint elements: an arrangement of latches and multiplexers in communication with a logic circuit. A set of checkpoint elements may allow a logic circuit to determine whether a sequence was applied to a particular portion of a circuit, and whether the sequence was successfully executed during a profiling event. In some embodiments, several checkpoint elements may be used to track the sequence at various points in a circuit. The checkpoint elements may communicate with a logic circuit, for example, a programmable matrix and/or finite state machine (FSM), to provide information regarding the order in which the checkpoint elements received the sequence, and whether the expected values were output from the checkpoint elements. In some embodiments, each checkpoint element may be disabled as it successfully executes the sequence, and all checkpoint elements may be disabled if the execution of the sequence fails. Information regarding the order in which checkpoint elements are disabled may aid in debugging and/or pinpointing a failure among circuit elements.

The term "couple" or "coupled" includes indirect and direct electrical connection. Thus, if a first device is coupled to a second device, that connection may be through a direct electrical connection, or through an indirect electrical connection via other devices and connections.

Turning now to the figures, FIG. 1 depicts a checkpoint element 150 in an electronic circuit environment 100, according to various embodiments. The checkpoint element 150 may be one checkpoint element of a set of checkpoint elements in communication with a clock 130 and logic circuit 125. The logic circuit 125 may include a matrix and an FSM. The matrix may be, for example, an array of memory elements having stored values for determining whether a checkpoint element or set of checkpoint elements has successfully executed a bit sequence. The matrix may be programmable, such as, for example, a memory cell array or a field programmable gate array (FPGA) and may be substantially similar to, for example, a programmable matrix 300 shown in FIG. 3. An FSM may be, for example, a mathematical model of computation that can be in one state of a finite number of states at any given time, and may be substantially similar to, for example, the FSM 200 shown in FIG. 2. In some embodiments, an FSM may be constructed from a set of logic circuits and storage elements (e.g., latches). An FSM may transition from one state to the next in response to an external input or signal, and the FSM may include a start, pass, and a fail state, as well as any number of intermediate states, such as, for example, states $A_0$-$A_n$ shown in FIG. 2.

The logic circuit 125 may be coupled to a clock 130, a multiplexer (MUX) 120, and a latch 110. The logic circuit 125 may, at the beginning of a profiling event, signal the clock 130 to initialize the checkpoint element 150 and one or more other checkpoint elements in the set of checkpoint elements. A beginning of a profiling event (e.g. an initialization event) may, for example, begin generating and outputting clock sequences along connections 155 and 160 and put the individual elements of checkpoint element 150 into a "primed" state. A "primed" state may be a state in which the configuration of every individual element of a checkpoint element, for example, every latch and MUX, is known.

The latch 115 may be coupled to the clock 130 and a MUX 105. The latch 115 may receive and pass on a scan path sequence along connection 135 from an element external to the checkpoint element 150. In response to receiving the scan sequence along connection 135 and an actuating clock input along connection 155, the latch 115 may generate a first output along connection 185. The first output may be a bit sequence to select an input of MUX 105.

The MUX 105 may be coupled to the latch 115 and a latch 110. The MUX 105 may receive two functional path bit sequences along connection 140. In some embodiments, the MUX 105 may receive a first functional path bit sequence from connection 140 at a first and the inverted first functional path bit sequence at a second input. Upon receiving the output from latch 115, the MUX 105 may generate an output along connection 145 to latch 110.

Latch 110 may be coupled to MUX 105, MUX 120, and the logic circuit 125. The latch 110 may receive, as a data input, the output of MUX 105 along connection 145, and generate an output along connection 165 to the logic circuit 125. Latch 110 may generate the output to logic circuit 125 in response to receiving a clock signal from MUX 120 along connection 180.

The logic circuit 125 may receive the output from the latch 110 and determine, using a matrix or other programmable logic or memory array, whether the output from latch 110 includes an expected value. In response to the determination that the output includes the expected value, the logic circuit 125 may generate a select control signal along connection 175 to drive or control select inputs of MUX 120 and cause it to disable the checkpoint element. For example, if the expected value is a "1," the logic circuit 125 may, in response to receiving the "1," transmit a select control signal to MUX 120 and cause MUX 120 to select latch disable signal 190. In response to a determination that the output does not include an expected value, the logic circuit 125 may generate a fail signal along connection 170 to the clock 130 to disable all checkpoint elements within the set of checkpoint elements.

The MUX 120 may be coupled to latch 110, clock 130, and logic circuit 125. The "primed" state of MUX 120 may be to output the clock signal received along connection 160 to latch 110 via connection 180. MUX 120 may be "primed" by an initialization signal from logic circuit 125 along connection 175. In some embodiments, the MUX 120 may receive a select control signal along connection 175 from the logic circuit 125. The select control signal may cause the MUX 120 to disable the clock signal to latch 110 by selecting the latch disable signal 190, thereby disabling the checkpoint element 150.

The clock 130 may be coupled to latch 115, MUX 120, and logic circuit 125. The clock may receive an initialization signal along connection 170 from the logic circuit 125 to initialize the checkpoint element 150 and any other checkpoint elements within the set of checkpoint elements. The clock 130 may also receive a fail signal along connection 170 to disable the clock 130, thereby disabling all checkpoint elements within the set of checkpoint elements, including checkpoint element 150. In some embodiments, the clock signals transmitted along connections 155 and 160 may be the same clock signal.

Figure 2:
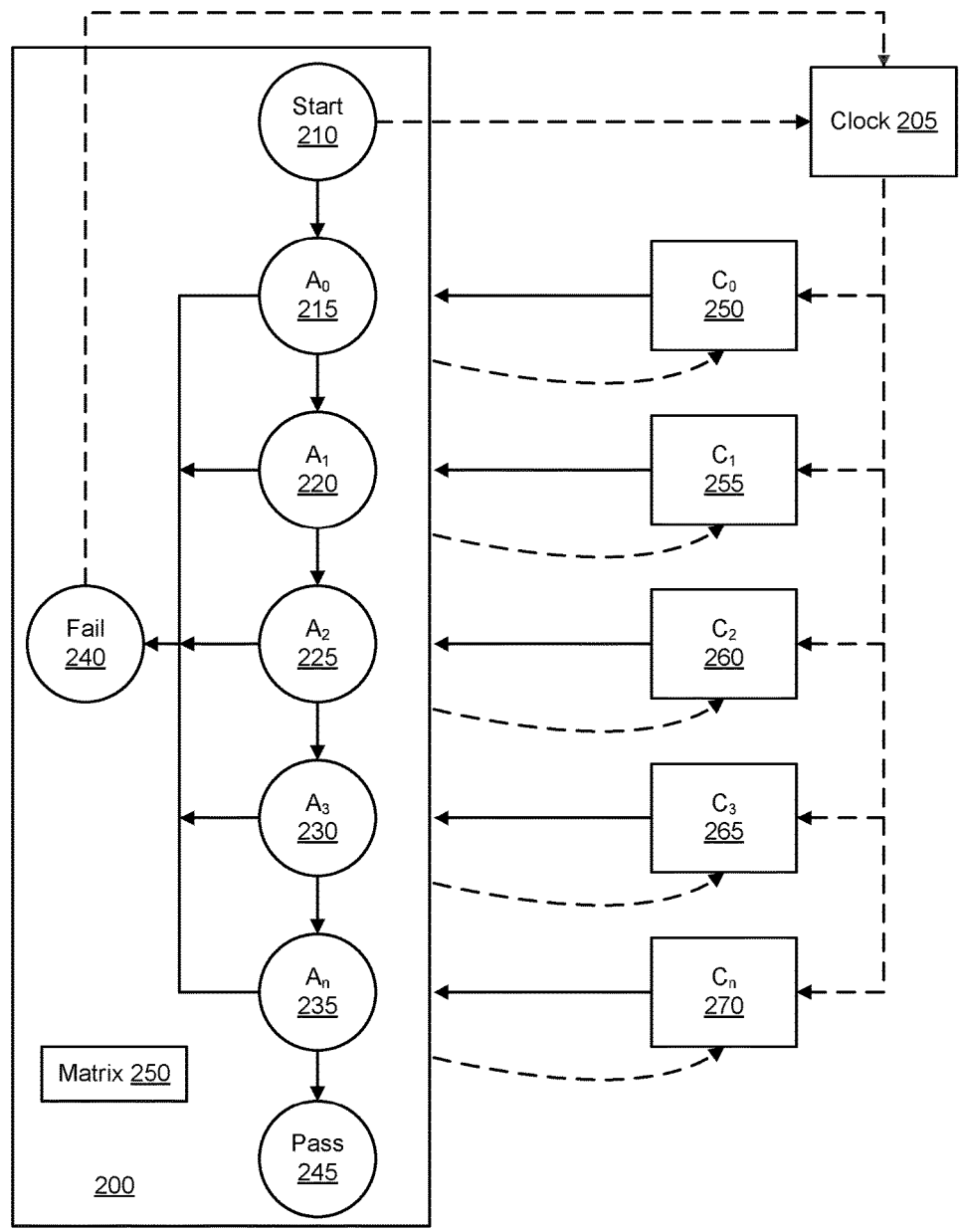
FIG. 2 depicts a finite state machine, communicatively coupled to checkpoint elements and a clock, according to various embodiments.

Referring now to FIG. 2, depicted is a finite state machine 200, communicatively coupled to checkpoint elements $C_0$-$C_n$, illustrated as checkpoint elements 250, 255, 260, 265, and 270, and clock 205, according to various embodiments. The checkpoint elements 250, 255, 260, 265, and 270 may resemble checkpoint element 150 shown in FIG. 1, and the FSM 200 may be included in, or communicatively coupled to, logic circuit 125 shown in FIG. 1.

In embodiments, FSM 200 may include intermediate states $A_0$-$A_n$, illustrated as states 215, 220, 225, 230, and 235. The FSM 200 may additionally include a "Start" state 210, a "Pass" state 245, and a "Fail" state 240. In embodiments, an FSM may include one or more intermediate states and may be coupled to one or more checkpoint elements.

In conjunction with a profiling event, the FSM 200 may begin at the "Start" state 210. As part of state 210, the FSM may initialize clock 205 and checkpoint elements 250, 255, 260, 265, and 270. Clock 205 may transmit clock signals to checkpoint elements 250, 255, 260, 265, and 270. The beginning of a profiling event may resemble the clock 130 and MUX 120 shown in FIG. 1 receiving an initialization signal, as described herein, and transmitting clock signals along connections 155 and 160 shown in FIG. 1, as described herein, respectively. The FSM may then transition to state $A_0$, or state 215, to await input from the checkpoint elements 250, 255, 260, 265, and 270. The inputs may be received from, for example, the output of latch 110 shown in FIG. 1.

As input is received from checkpoint elements 250, 255, 260, 265, and 270, the inputs are compared to the FSM states 215, 220, 225, 230, and 235 using matrix 250 to determine whether they were received in the expected order. As expected values are received from the checkpoint elements in the expected order, the FSM 200 may transition to subsequent states. The FSM may transition, for example, from $A_0$ to $A_1$, $A_1$ to $A_2$, $A_3$ to $A_4$, etc. For example, if the FSM 200 is coupled to checkpoint elements $C_0$-$C_n$, and the expected order is $C_3$, $C_2$, $C_5$, $C_1$, $C_0$, $C_n$, the FSM 200 may transition states if the checkpoint elements transmit expected values in the order $C_3$, $C_2$, $C_5$, $C_1$, $C_0$, $C_n$. For example, the matrix 250 may include logic gates configured to receive a non-inverted input from an expected checkpoint element, and inverted inputs from all other checkpoint elements. For example, if the logic gate for state $A_0$ expects input from checkpoint element $C_2$, the input from $C_2$ may be ANDed with the inverted inputs of the remaining checkpoint elements. If the logic gate for subsequent state $A_1$ expects input from checkpoint element $C_4$, the input from $C_4$ may be ANDed with the inverted inputs of the remaining checkpoint elements. This configuration of logic gates ANDed with inverted inputs of unexpected checkpoint elements may enable FSM state transitions without directly comparing bit values.

Figure 3:
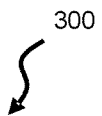
FIG. 3 depicts a programmable matrix, according to various embodiments.

The checkpoint element order may be included in a logic array, such as the programmable matrix 300 shown in FIG. 3. If the expected values are transmitted from the expected checkpoint elements in the expected order, then the FSM 200 may transition to "Pass" state 245, and a pass notification may be sent to a user. When each state receives the expected value from the expected checkpoint element, it may perform an exit action to disable that checkpoint element (e.g., a disabling event). A disabling event resemble FIG. 1 where logic circuit 125 of may send a select control signal to MUX 120 to disable checkpoint element 150. Recording the times at which individual checkpoint elements are disabled may allow for a timestamp list of checkpoint elements that have successfully executed sequences and allowed the FSM 200 to transition states.

If, however, at any state the FSM 200 receives an active input from an unexpected checkpoint element, or receives an unexpected value from an expected checkpoint element, the FSM 200 may transition to "Fail" state 240. Transitioning to "Fail" state 240 may cause the FSM 200 to send a signal to the clock 205 to cause the clock to stop transmitting clock signals, thereby disabling all checkpoint elements. Disabling all checkpoint elements may enable a user to identify an incorrect or altered sequence, or otherwise facilitate debugging efforts via a timestamp list illustrating when each checkpoint element was disabled. Because successfully performing checkpoint elements may be disabled one-by-one, and the first unsuccessful checkpoint element may cause all remaining checkpoint elements to be disabled at the same time, a timestamp list of when the checkpoint elements were disabled may allow a user to locate the incorrect or altered section of the sequence and/or the specific checkpoint element that failed.

Referring now to FIG. 3, depicted is a programmable matrix 300, according to various embodiments. The programmable matrix 300 may include, for example, an FPGA, or any other logic array capable of determining whether an input conforms to at least two criteria. Programmable matrix 300 may be included in, for example, logic circuit 125 shown in FIG. 1 and may implement or embody a state transition table for the FSM shown in FIG. 2. The programmable matrix 300 may be configured with two sets of criteria, such as, for example, a checkpoint element designation along one dimension (e.g., rows of the programmable matrix) and advances in states and/or time along another dimension (e.g., columns of the programmable matrix). A logic circuit may receive inputs from the checkpoint elements and, using the programmable matrix 300, determine whether the input comes from an expected checkpoint element. For example, logic circuit 125 shown in FIG. 1 may receive input from a latch, such as latch 110 shown in FIG. 1, and the logic circuit may, using programmable matrix 300 as described herein, determine whether the input included an expected value and was received from an expected checkpoint element, according to the current state of the FSM.

If the programmable matrix 300 is a state transition table for FSM 200 of FIG. 2, the first state after initialization would be $A_0$. State $A_0$ calls for checkpoint element $C_0$ to provide input "X." X may represent either a "0" or a "1" of a binary sequence. If checkpoint element $C_0$ transmits expected input "X," then the FSM 200 of FIG. 2 may transition to the next state, $A_1$. Additionally, as an exit action, the FSM may send a signal to disable checkpoint element $C_0$. FSM state $A_1$ expects checkpoint element $C_3$ to transmit input "X." If the next input the FSM receives is "X" from checkpoint element $C_3$, then the FSM may transition to state $A_2$. This process of receiving expected inputs may repeat until either the final state $A_n$ is reached, whereupon fulfilling the conditions of state $A_n$ may cause the FSM to transition to the "Pass" state, such as the "Pass" state 245 of FIG. 2. Alternatively, the FSM may transition to subsequent states until either an unexpected checkpoint element transmits an active input (e.g., $C_2$ transmits an active input when $C_3$ is expected to transmit an active input), or an expected checkpoint element transmits an unexpected value (e.g. the expected checkpoint element transmits an unexpected "0" instead of an expected "1"). If, in any state from $A_0$ to $A_n$, an unexpected checkpoint element transmits any active input, or if an expected checkpoint element transmits an unexpected value, the FSM may transition to a "Fail" state, such as the "Fail" state 240 of FIG. 2.

The expected values and the order of the checkpoint elements may be programmed in any configuration a user desires. In some embodiments, the expected values may be preprogrammed one or more times. The programmable matrix 300 may include one or more intermediate states. The particular configuration of programmable matrix 300 shown in FIG. 3 is for illustrative purposes and is not meant to be limiting in any sense.

Figure 4:
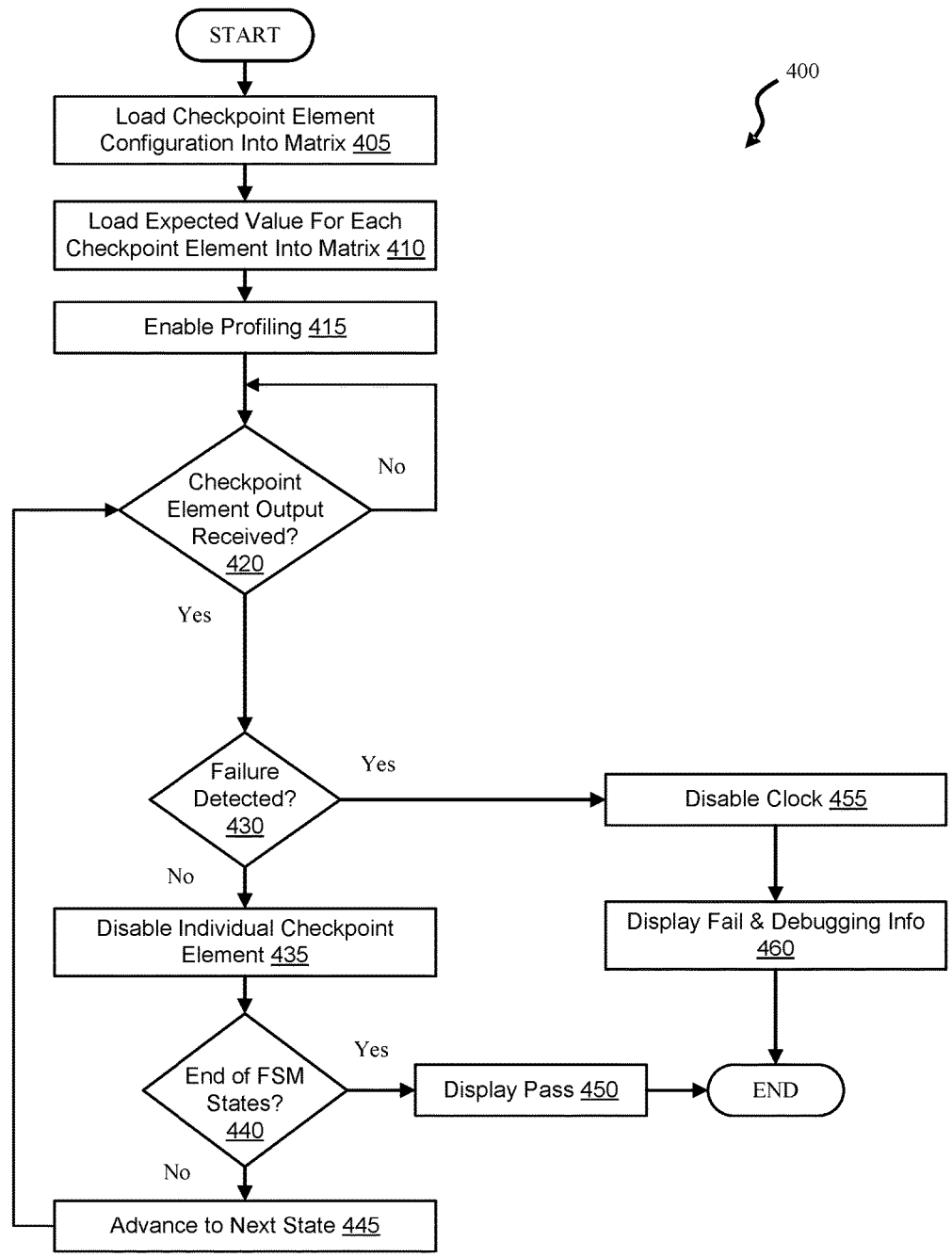
FIG. 4 depicts a flow diagram of a method for profiling on-chip application sequences, according to various embodiments.

FIG. 4 depicts a flow diagram of a method 400 for profiling on-chip application sequences, according to various embodiments. At 405 and 410, a checkpoint element configuration and the expected values for each checkpoint element are loaded into a programmable matrix. As described above, the matrix may be an FPGA or other programmable logic array or circuit. For example, the matrix may resemble programmable matrix 300 shown in FIG. 3.

At 415, profiling may be enabled. This may be substantially similar to an initialization event, or the beginning of a profiling event, as described herein.

At 420, a determination may be made regarding whether a checkpoint element output has been received. For example, it may be determined whether an FSM, such as the FSM 200 of FIG. 2, has received an output from a checkpoint element, such as checkpoint element 250 of FIG. 2.

At 430, a determination may be made regarding whether a failure has occurred. For example, a matrix, such as programmable matrix 300 shown in FIG. 3, may be consulted to determine whether the checkpoint element from which the output was received was the expected checkpoint element for the current FSM state, and whether the output included an expected value.

If, at 430, a failure has been determined, the clock for all checkpoint elements may be disabled at 455. For example, if an unexpected value is received from an expected checkpoint element, then the clock (e.g., clock 205 shown in FIG. 2) that is coupled to the checkpoint elements may be disabled, thereby disabling all checkpoint elements.

At 460, information about the failure and debugging information may be displayed to a user. For example, information may be displayed informing the user that, at state $A_3$, the expected checkpoint element $C_6$ output the unexpected value of "0," and that this event caused the FSM to transition to the "Fail" state. The information may also include a timestamp list of when each checkpoint element was disabled, or other information for debugging.

If, at 430, a determination is made that no failure occurred, the checkpoint element that successfully executed the sequence may be disabled. For example, if a logic circuit determines that the output from checkpoint element $C_2$ was not a failure, the logic circuit may transmit a signal to checkpoint element $C_2$ to disable that checkpoint element, as described herein. For example, using FIG. 1, if logic circuit 125 determines that the output from latch 110 was not a failure, the logic circuit may transmit a select control signal to MUX 120 to disable the clock signal from reaching latch 110, thereby disabling the checkpoint element 150.

At 440, a determination may be made regarding whether the FSM is at the final state. For example, it may be determined that the FSM is at the final state, such as state 235 (e.g., state $A_n$) of FIG. 2.

If, at 440, a determination is made that the FSM is at the final state, the FSM may display a "Pass" notification to a user at 450. The "Pass" notification may be accompanied by additional information, such as a timestamp list of when each checkpoint element was disabled.

If, at 440, it is determined that the FSM is not at the final state, the FSM may transition to the next state at 445. For example, if the FSM shown in FIG. 2 is at state 225 (e.g., state $A_2$), it may advance to state 230 (e.g., state $A_3$).

Figure 5:
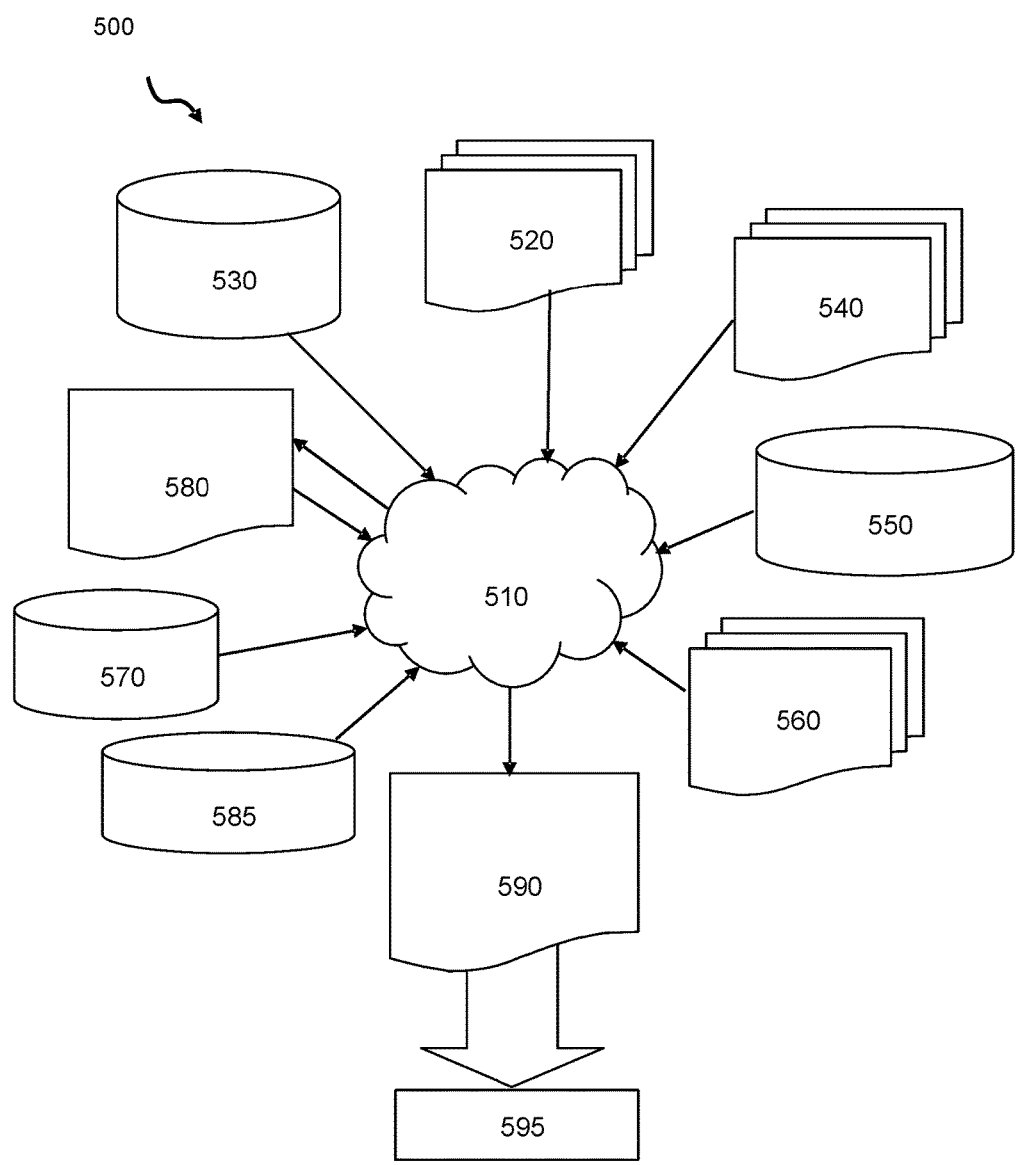
FIG. 5 is a flow diagram of a design process used in semiconductor design, manufacture, and/or test.

FIG. 5 shows a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices described above and shown in FIGS. 1-4. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 1-4. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1-4 to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 590 may comprise a compiled, executable HDL simulation model that functionally simulates the devices shown in FIGS. 1-4.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 590 may then proceed to a stage 595 where, for example, design structure 590: proceeds to tape-out, is released to manufacturing, is released to a mask house, is sent to another design house, is sent back to the customer, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method for profiling on-chip application sequences comprising:
    generating, for a profiling event to track a first bit sequence as it is applied to the internal latches of a chip and to determine whether the first bit sequence was executed successfully, a matrix for a logic circuit, the matrix having a first dimension corresponding to a sequence of time periods in the profiling event and a second dimension corresponding to a set of profilers, wherein a programmable element of the matrix stores a control signal applied to a first profiler during a first time period of the sequence of time periods;
    storing, in a first latch of the first profiler, a first bit of a scan sequence;
    selecting, by a first multiplexer of the first profiler based on the first bit, a first bit sequence of a set of two or more bit sequences;

determining, by a second multiplexer of the first profiler based on the control signal, whether to capture the first bit sequence;

latching, by a second latch of the first profiler in response to determining to capture the first bit sequence, a second bit of the first bit sequence during the first time period;

determining, by the logic circuit, whether the latched second bit has an expected value, the expected value indicated by the control signal and the first time period; and disabling, in response to determining that the second bit has the expected value, the second latch.

2. The method of claim 1, further comprising:
disabling, in response to determining that the second bit does not have the expected value, the profiling event.

3. The method of claim 1, wherein generating the matrix comprises programmable entries of expected values.

4. The method of claim 1, wherein the logic circuit is a finite state machine.

5. The method of claim 1, wherein the profiling event is a first profiling event of a set of profiling events and the programmable element of the matrix is programmed for each profiling event in the set of profiling events.

6. The method of claim 1, wherein the matrix is a field programmable gate array.

7. A circuit for profiling on-chip application sequences comprising:
a first latch of a sequence profiler, the first latch receiving a scan path bit sequence and a first clock signal, and wherein the first latch generates a first output in response to the scan path bit sequence and the first clock signal;

a first multiplexer of the sequence profiler coupled to the first latch, the first multiplexer receiving at least two functional path bit sequences and the first output to control a select input of the first multiplexer, and wherein the first multiplexer generates a second output in response to the functional path bit sequence and the first output;

a second latch of the sequence profiler coupled to the first multiplexer, the second latch receiving the second output and a latch control signal;

a second multiplexer of the sequence profiler to generate the latch control signal, the second multiplexer receiving an input from a second clock signal and a select control signal;

a logic circuit of the sequence profiler coupled to the second latch and the second multiplexer to:
receive a second output from the second latch; and
generate, using the second output, the select control signal.

8. The circuit of claim 7, wherein the logic circuit is a finite state machine.

9. The circuit of claim 7, wherein the sequence profiler is a first sequence profiler of a set of sequence profilers.

10. The circuit of claim 7, wherein the logic circuit includes a programmable matrix.

11. The circuit of claim 7, wherein the logic circuit is a field programmable gate array.

12. A design structure tangibly embodied in a non-transitory machine readable medium for designing, manufacturing, or testing an integrated circuit, the design structure comprising:
a first latch of a sequence profiler, the first latch receiving a scan path bit sequence and a first clock signal, and wherein the first latch generates a first output in response to the scan path bit sequence and the first clock signal;

a first multiplexer of the sequence profiler coupled to the first latch, the first multiplexer receiving at least two functional path bit sequences and the first output to control a select input of the first multiplexer, and wherein the first multiplexer generates a second output in response to the functional path bit sequence and the first output;

a second latch of the sequence profiler coupled to the first multiplexer, the second latch receiving the second output and a latch control signal;

a second multiplexer of the sequence profiler to generate the latch control signal, the second multiplexer receiving an input from a second clock signal and a select control signal;

a logic circuit of the sequence profiler coupled to the second latch and the second multiplexer to:
receive a second output from the second latch; and
generate, using the second output, the select control signal.

13. The design structure of claim 12, wherein the logic circuit is a finite state machine.

14. The design structure of claim 12, wherein the sequence profiler is a first sequence profiler of a set of sequence profilers.

15. The design structure of claim 12, wherein the logic circuit includes a programmable matrix.

16. The design structure of claim 12, wherein the logic circuit is a field programmable gate array.

17. The design structure of claim 12, wherein the design structure comprises a netlist.

18. The design structure of claim 12, wherein the design structure resides on storage medium as a data format used for the exchange of layout data of integrated circuits.

19. The design structure of claim 12, wherein the design structure resides in a programmable gate array.

* * * * *